(12) United States Patent  (10) Patent No.: US 7,394,318 B2
Mason  (45) Date of Patent: Jul. 1, 2008

(54) AMPLIFIER CONTROL SYSTEM

(75) Inventor: James Stephen Mason, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 11/469,766

(22) Filed: Sep. 1, 2006

(65) Prior Publication Data

US 2007/0096822 A1 May 3, 2007

(51) Int. Cl.
*H03G 3/20* (2006.01)
(52) U.S. Cl. ...................................... 330/285; 330/133
(58) Field of Classification Search ................. 330/133, 330/279, 285
See application file for complete search history.

(56) References Cited

U.S. PATENT DOCUMENTS 7,084,705 B2 * 8/2006 Prodanov ..................... 330/285

* cited by examiner

*Primary Examiner*—Steven J Mottola

(57) ABSTRACT

An amplifier control system for regulating the gain of a controlled amplifier. The control system comprises a first signal source for generating a first reference signal. A replica amplifier representative of the controlled amplifier generates an output signal in dependence on the first reference signal. A second signal source generates a second reference signal representative of the product of the first reference signal and a worst case value of the gain of the controlled amplifier. A comparator generates an error signal in dependence on any difference between the second reference signal and the output from the replica amplifier. A negative feedback loop varies the gain of the controlled amplifier and the replica amplifier in dependence on the error signal.

18 Claims, 9 Drawing Sheets

AMPLIFIER CONTROL SYSTEM

CROSS REFERENCE TO RELATED APPLICATIONS

The application claims the benefit of priority under 35 U.S.C. § 119(a) to foreign application Serial No. 0518014.6, filed in the United Kingdom on 3 Sep. 2005, and entitled "Amplifier Control System"

FIELD OF THE INVENTION

The present invention generally relates to an amplifier control system and particularly relates to a control system for regulating the gain of an amplifier.

BACKGROUND OF THE INVENTION

Conventionally, amplifiers are used in wide range of electrical applications. The output of an amplifier for a given input is determined by a transfer function or gain of the amplifier. A problem associated with conventional amplifiers is unwanted variation in gain. Such unwanted variation can arise for a range of reasons, including changes in supply voltages and changes in temperature. It would be desirable to provide an amplifier in which unwanted variation in gain is minimised.

SUMMARY OF THE INVENTION

In accordance with the present invention, there is now provided an amplifier control system for regulating the gain of a controlled amplifier, the control system including a first signal source configured to generate a first reference signal, a replica amplifier representative of the controlled amplifier, the replica amplifier configured to generate an output signal in dependence on the first reference signal, a second signal source configured to generate a second reference signal representative of the product of the first reference signal and a worst case value of the gain of the controlled amplifier, a comparator configured to generate an error signal in dependence on any difference between the second reference signal and the output from the replica amplifier, and a negative feedback loop configured to vary the gain of the controlled amplifier and the replica amplifier in dependence on the error signal.

The replica amplifier may comprise a variable gain amplifier having a variable gain input connected to the negative feedback loop. The feedback loop may comprise a variable current sink connected to the variable gain input of the replica amplifier. The first signal source may comprise a potential divider connected to the second signal source. The feedback loop may comprise a sample and hold circuit for selectively sampling the error signal in dependence on a binary enable signal. The replica amplifier may comprise an enable input for selectively enabling and disabling the replica amplifier in dependence on the enable signal. Similarly, the comparator may comprise an enable input for selectively enabling and disabling the comparator in dependence on the enable signal. This advantageously provides a saving in power during periods when the feedback loop is inactive.

One embodiment of the present invention extends to an amplifier system comprising a controlled amplifier and a control system as herein before described connected to the controlled amplifier for regulating the gain of the controlled amplifier. The controlled amplifier may comprise a plurality of amplifier stages. The replica amplifier preferably comprises fewer components than the controlled amplifier, but nevertheless represents the behaviour of the controlled amplifier.

One embodiment of the present invention extends to an application specific circuit comprising an amplifier system as herein before described.

In one embodiment of the present invention, there is provided a control system for regulating the gain of an amplifier to a worst case value. This approach is particularly useful in applications such as decision feedback equalisation (DFE) systems where excess gain can be especially problematical.

In a further embodiment of the present invention, the control system comprises a duplicate of the controlled amplifier or other circuit representative of the controlled amplifier. The duplicate amplifier, or representative circuit as the case may be, will be hereinafter referred to as a replica amplifier. The control system also comprises a control loop. In operation, the control loop adjusts an electrical value in both the replica amplifier and the controlled amplifier, such as operating current for example, to obtain a predefined worst case gain available without the control loop. By regulating the gain to such a worst case value, the controlled amplifier will have the same gain under all other operating conditions but at lower electrical power than it would otherwise have had. In this manner, the gain of the controlled amplifier is regulated, and power consumption is reduced. Other advantages will be apparent to those skilled in the art.

BRIEF DESCRIPTION OF THE DRAWINGS

Preferred embodiments of the present invention will now be described, for way of example only, with reference to the accompanying drawings, in which.

DETAILED DESCRIPTION OF THE PREFERRED EMBODIMENTS

Figure 1:
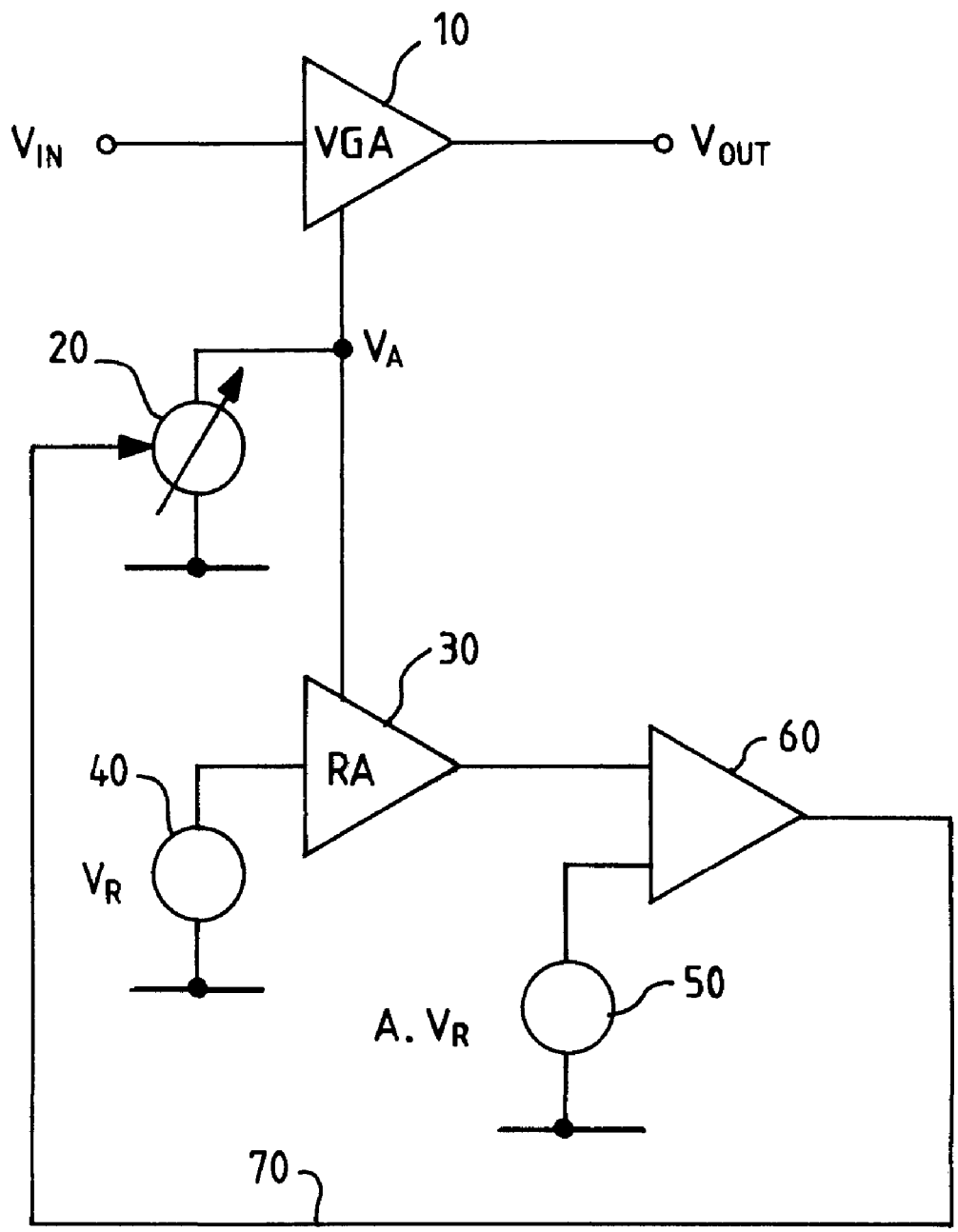
FIG. 1 is a block diagram of an amplifier system in accordance with one embodiment of the present invention.

Referring first to FIG. 1, a first embodiment of the present invention comprises a controlled amplifier 10 in the form of a variable gain amplifier (VGA). In operation, the controlled amplifier produces an output voltage signal $V_{out}$ in dependence on an input voltage signal $V_{in}$ multiplied by the gain of the amplifier 10. The gain of the amplifier is controlled by a direct current (DC) gain input voltage value $V_A$. $V_A$ is generated by a regulated voltage source 20.

$V_A$ is also supplied to a gain control input of a replica amplifier 30. The replica amplifier 30 is a replica of the controlled amplifier 10. The input of the replica amplifier 30 is connected to a first reference voltage source 40. In operation, the first reference voltage source 40 generates a reference voltage $V_R$ on the input of the replica amplifier 30.

The output of the replica amplifier 30 is connected to one input of a comparator 60. The other input of the comparator 60 is connected to second reference voltage source 50. In operation, the second reference voltage source 50 generates a DC value $A.V_R$ at the other input of the comparator 60. The DC value $A.V_R$ is the product of the reference voltage $V_R$ and a worst case gain value for the controlled amplifier 10 and the replica amplifier 30. In operation, the comparator 60 generates an output error signal representative of any difference between the output of the replica amplifier 30 and $A.V_R$. The error signal is fed to a control input of the voltage source 20 via a negative feedback loop 70. The error signal thus regulates the gain control value $V_A$ supplied to the gain control inputs of the controlled amplifier 10 and the replica amplifier 30. Variations in gain of the controlled amplifier 10 relative to the worst case value A are minimised via the comparator 60 and the feedback loop 70.

Figure 2:
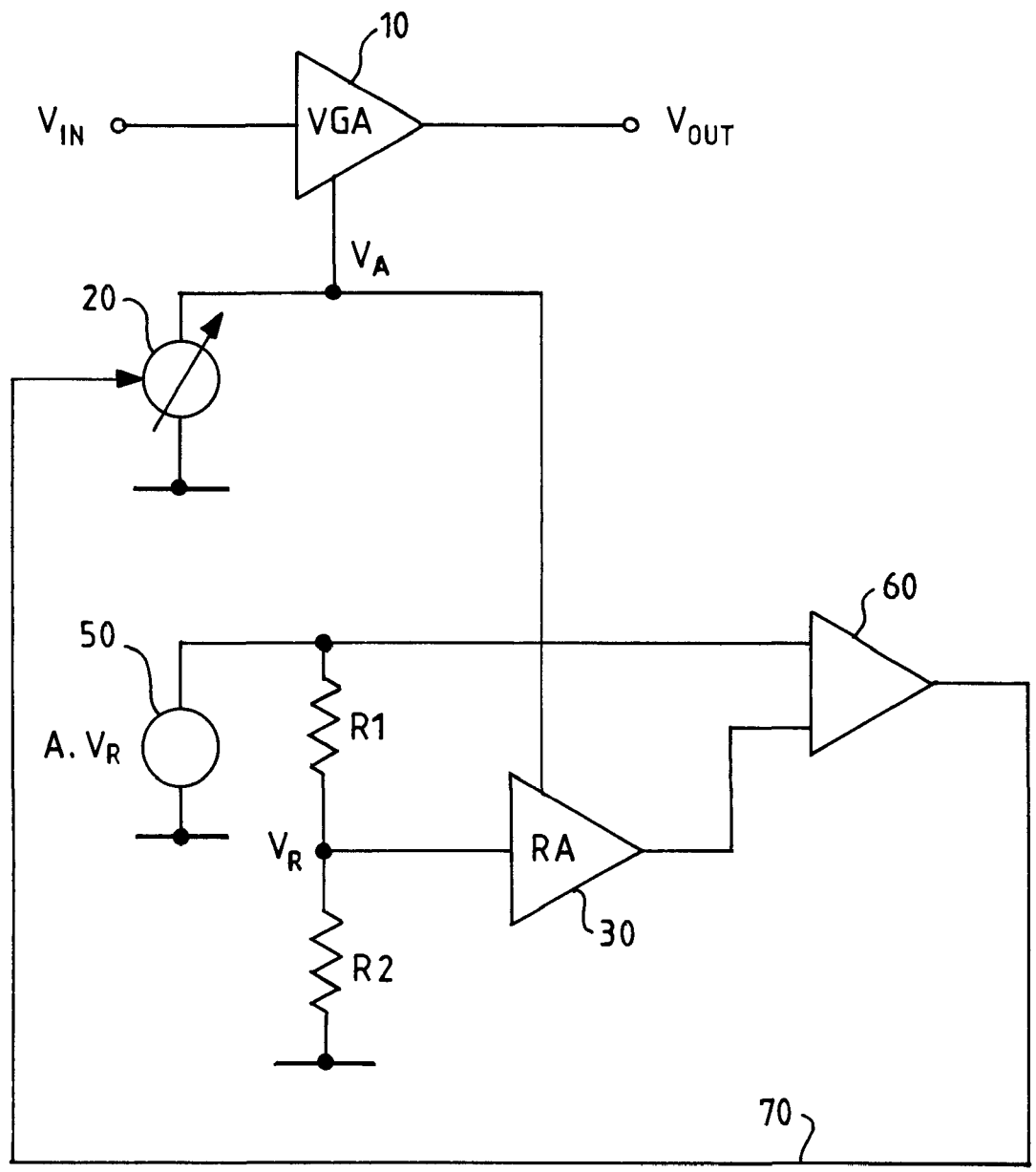
FIG. 2 is a block diagram of another amplifier control system in accordance with one embodiment of the present invention.

Referring now to FIG. 2 in another embodiment of the present invention, the first voltage source 40 is replaced by a potential divider constituted by series resistors R1 and R2 connected to the second voltage source 50. The reference voltage $V_R$ at the input of the replica amplifier 30 is then derived, via the potential divider, from the DC value $A.V_R$ supplied to one input of the comparator 60. The worst case gain of the controlled amplifier 10 is thus represented simply by a ratio of resistors R1 and R2. This provides an advantageously simple circuit design. R1 and R2 may be provided within a reference block of an integrated circuit implementation of the present invention.

Figure 3:
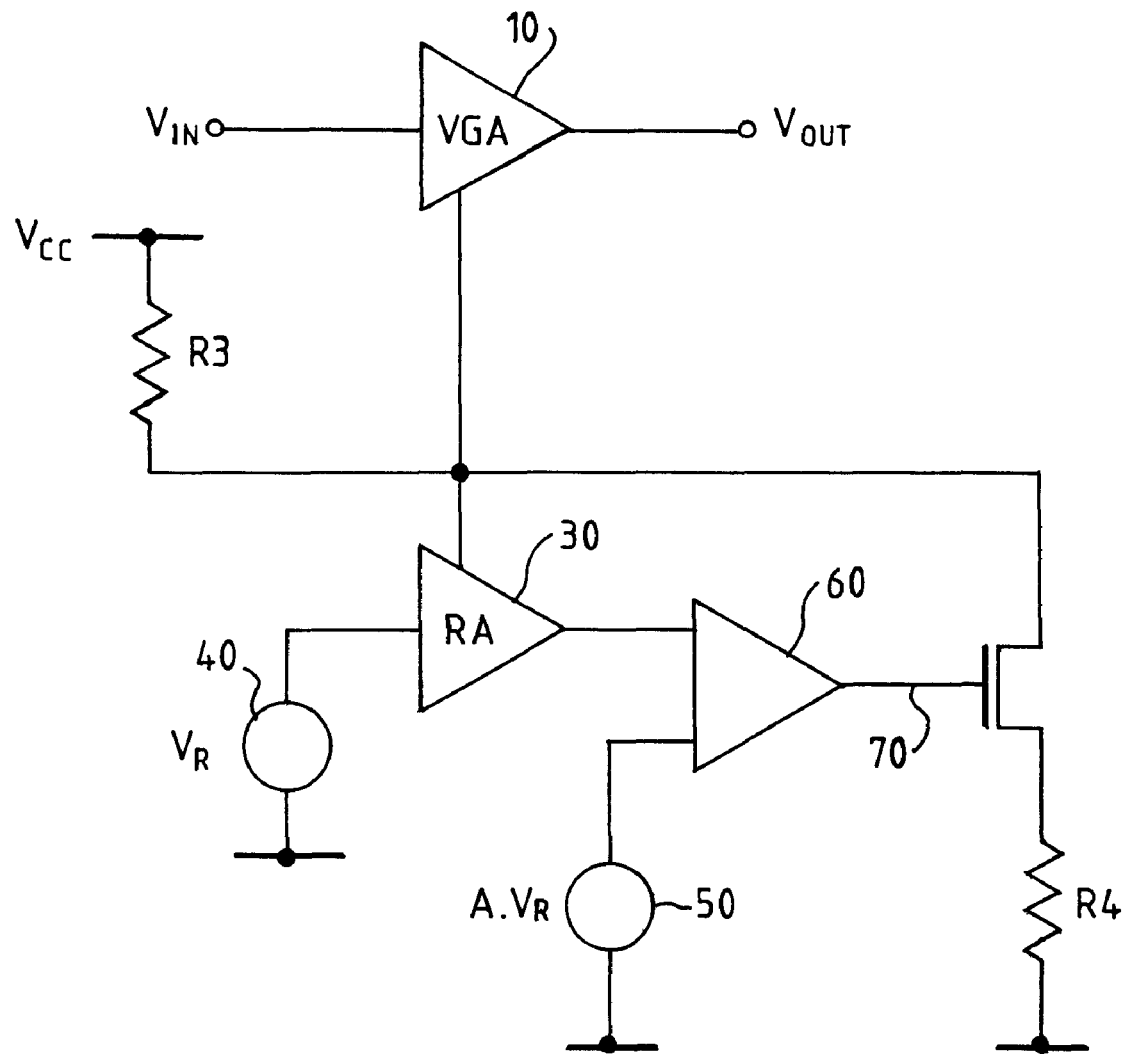
FIG. 3 is a block diagram of yet another system in accordance with one embodiment of the present invention.

With reference to FIG. 3, in another embodiment of the present invention, the regulated voltage source 20 is implemented by a potential divider constituted by series resistors R3 and R4, together with field effect transistor (FET) T1. The potential divider formed by R3 and R4 is connected between supply voltage lines of the amplifier. There is a node between resistors R3 and R4 connected to the gain control inputs of the controlled amplifier 10 and the replica amplifier 30. In operation, current flow through R3 and R4 is regulated by T1. Thus the voltage applied to the gain control inputs of the controlled amplifier 10 and the replica amplifier 30 is regulated by T1. The gate of T1 is connected to the output of the comparator 60, thus completing the feedback loop 70. R3 and R4 may also be provided within a reference block of an integrated circuit implementation of the present invention. In this arrangement, the gain control can be made only to reduce or "back off" gain to its worst case value, thereby assisting stability of the system.

Figure 4:
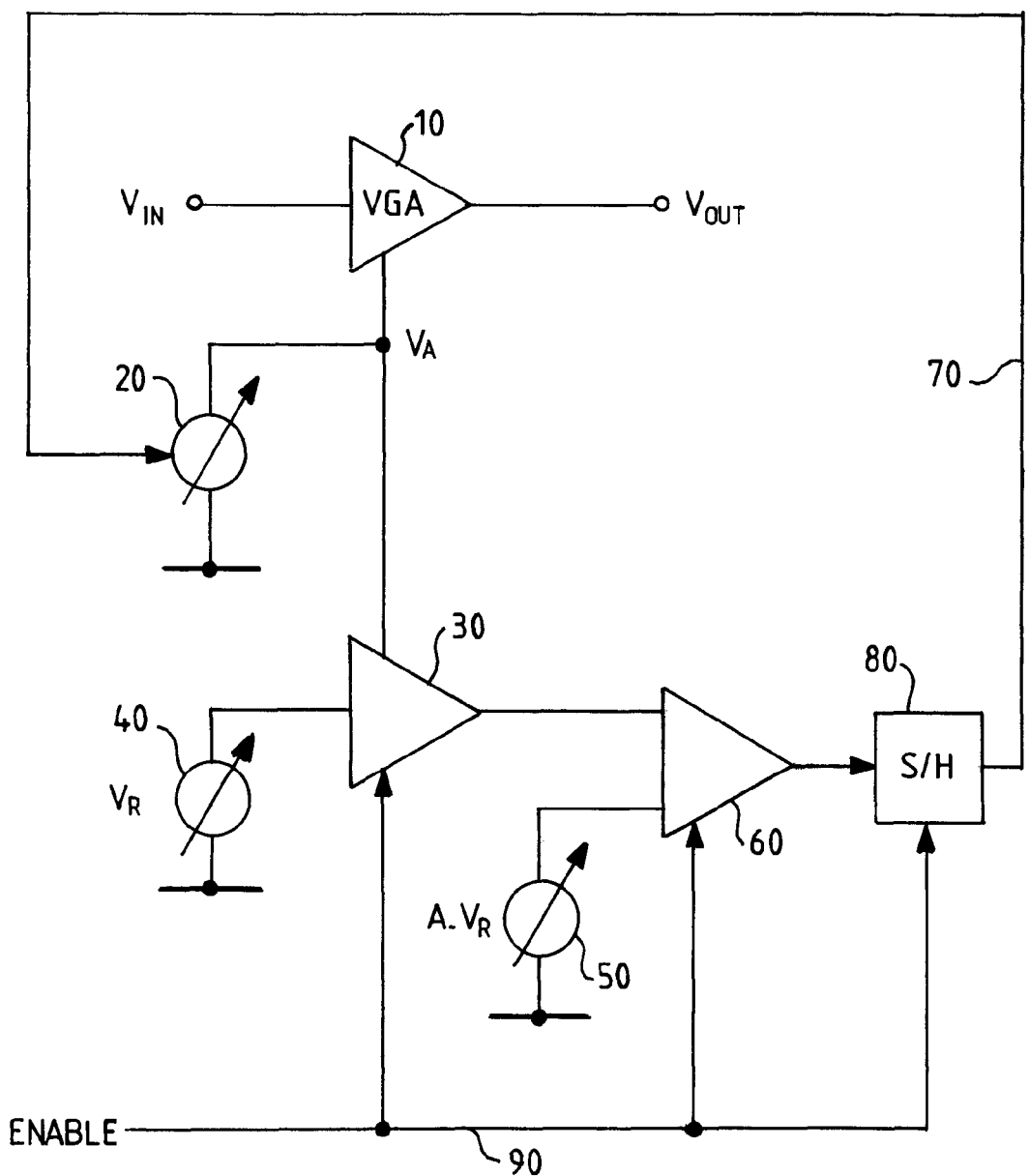
FIG. 4 is a block diagram of a further system in accordance with one embodiment of the present invention.

Turning now to FIG. 4, in a modification to the first embodiment of the present invention herein before described with reference to FIG. 1, there is provided a sample and hold circuit 80 at the output of the comparator 60. The sample and hold circuit 80 has a sample state and hold state. In the sample state, the output of the sample and hold circuit 80 varies according to the input. In the hold state, the output of the sample and hold circuit 80 is maintained at the last value of the input before the circuit was switched from the sample state into the hold state. In addition, the replica amplifier 30 and the comparator 60 each have an enable input. In operation, the replica amplifier 30 can be selectively enabled and disabled in dependence on the state of its enable input. The enable inputs of the replica amplifier 30 and the comparator 60 are connected to a common enable line 90.

In operation, the enable line 90 is set to one of first and second levels. When the enable line 90 is set to the first level, the replica amplifier 30 and the comparator 60 are enabled and the sample and hold circuit 80 is set to the sample state. The output of the sample and hold circuit 80, and therefore the feedback loop 70, varies according to the output of the comparator 60. When the enable line 90 is set to the second level, the replica amplifier 30 and the comparator 60 are disabled and the sample and hold circuit 80 is set to the hold state. The output of the sample and hold circuit 80, and therefore the feedback loop 70, is therefore held at the last value sampled at the output of the comparator 60.

It will be appreciated that, by applying to the enable line a binary signal alternating between the first and second level, the replica amplifier 30 and comparator 60 may be alternately activated and deactivated and the sample and hold circuit 80 periodically switched between sample and hold states. By permitting selective deactivation of the replica amplifier 30 and comparator 60, this sample and hold technique permits significant power saving within the system. It will be appreciated that the technique may be additionally or alternatively applied to the selective activation and deactivation of the voltage sources 40 and 50. The frequency of the binary signal determines the quality of gain control provided and the level of power saving. The quality of gain control increases with increasing frequency of the binary signal. Likewise however, the level of power saving reduces with increasing frequency of the binary signal. It will be appreciated that the balance struck between gain control and power saving may vary in dependence on the application of the amplifier system.

Figure 5:
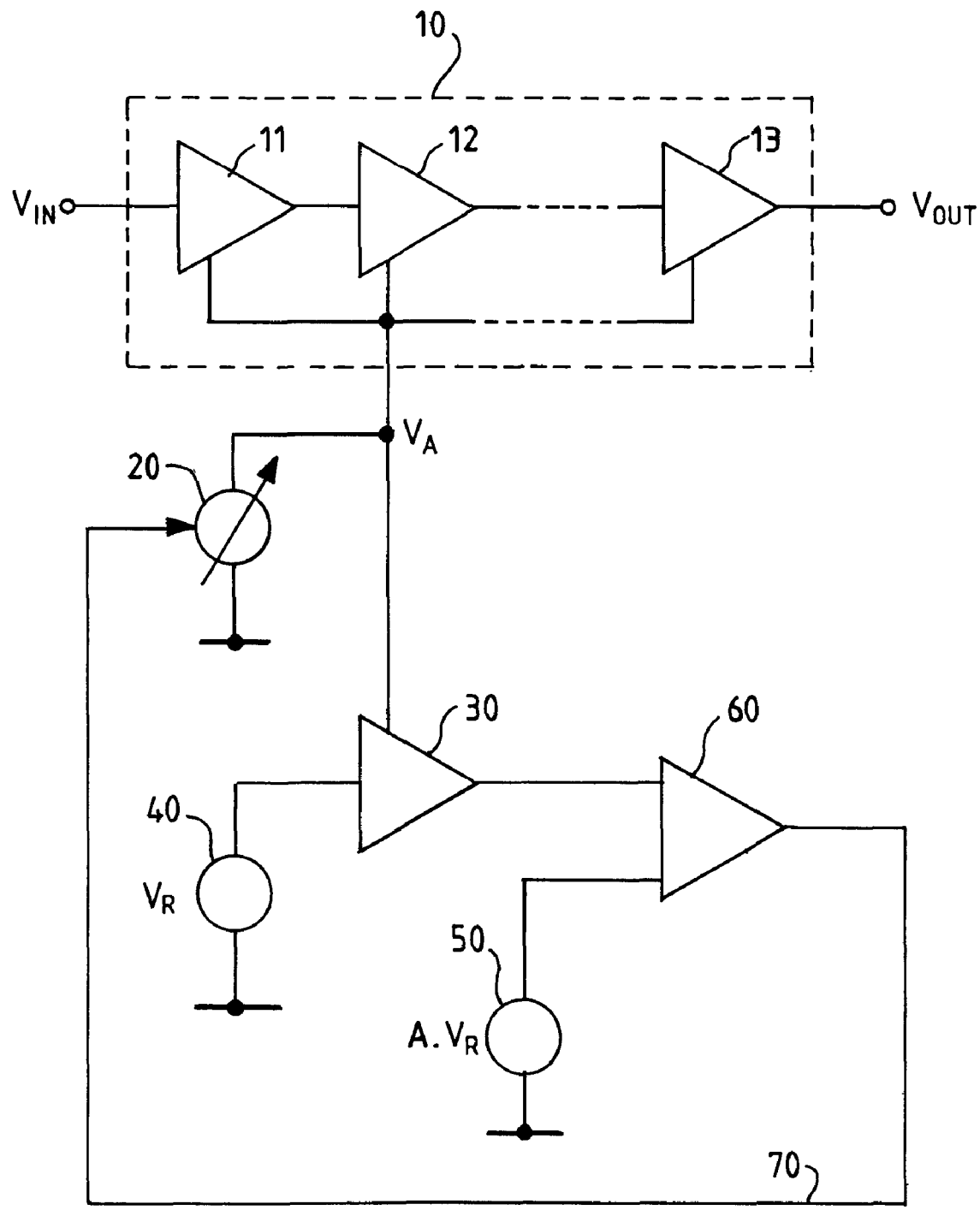
FIG. 5 is a block diagram of a multistage system in accordance with one embodiment of the present invention.

Referring to FIG. 5, in another embodiment of the present invention, the controlled amplifier 10 is a multistage amplifier comprising a plurality of variable gain amplifier stages 11-13 in series. The variable gain inputs of the amplifier stages 11-13 are connected to a common node. The replica amplifier 30 is configured to model the amplifier stages 11-13 collectively as the multistage amplifier 10. Importantly however, the replica amplifier 30 need not itself comprise a multistage amplifier. In one embodiment of the present invention, the replica amplifier 30 is much simpler in design than the controlled amplifier 10. Accordingly, the replica amplifier 30 need not occupy the same silicon real estate, use the same power, or involve the same device complexity, as the controlled amplifier 10. Advantageously, the replica amplifier 30 may use less power and involve fewer components than the controlled amplifier 10. It should also be appreciated that an increase in the number of stages in the controlled amplifier 10 does not necessarily lead to a correspondingly upward scaling in complexity of the replica amplifier 30.

Figure 6:
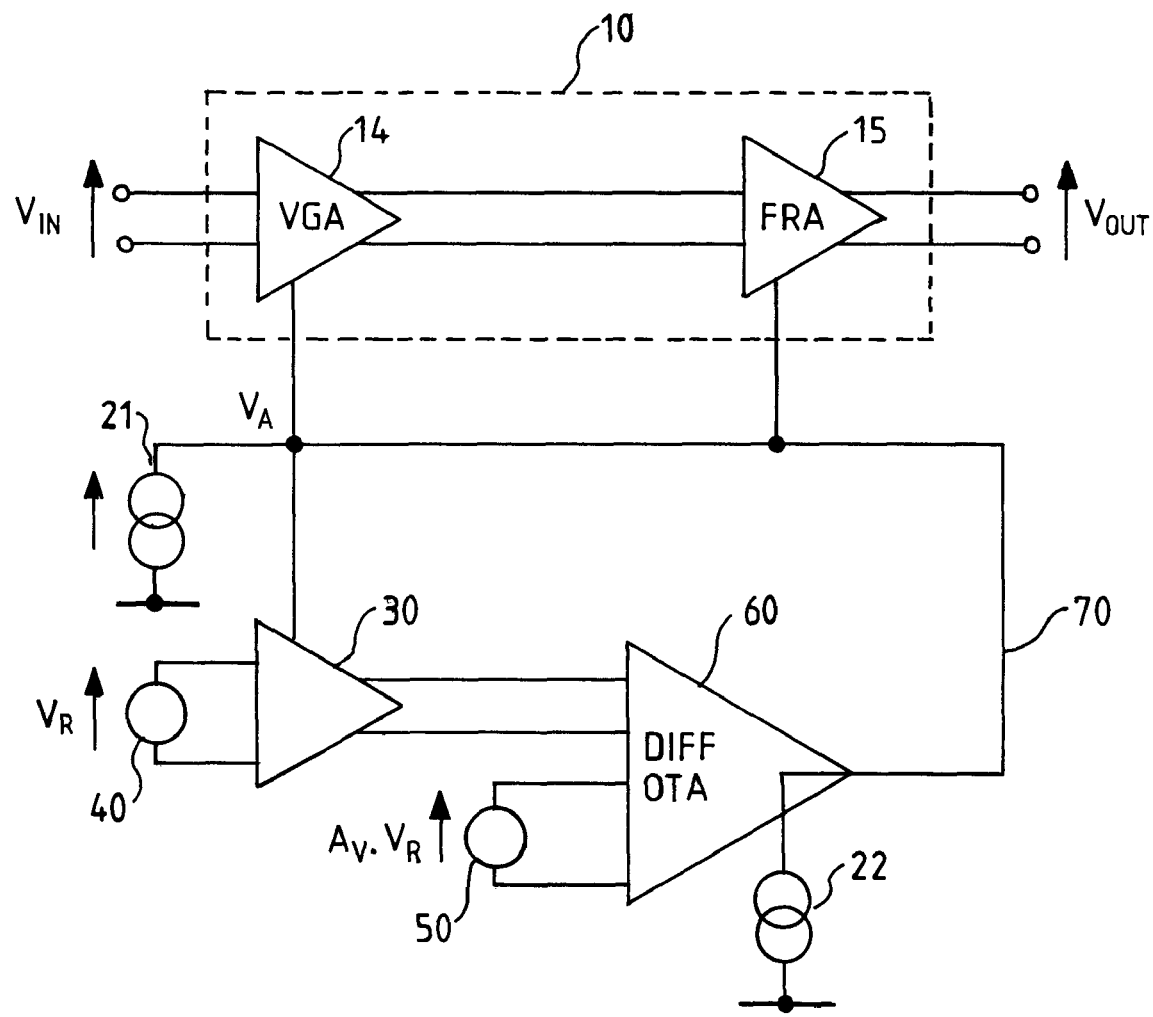
FIG. 6 is a block diagram of another multistage system in accordance with one embodiment of the present invention.

Referring now to FIG. 6, in a further embodiment of the present invention, the controlled amplifier 10 comprises a multistage amplifier having a differential input variable gain amplifier (VGA) 14 connected in series to a differential input fixed performance amplifier (FPA) 15. The VGA 14 and FPA 15 each have a gain control input adjusted by current input connected to a current source 21. The current source 21 is also connected to the gain control input of the replica amplifier 30. The replica amplifier 40 models the controlled amplifier 10. In this example, the replica amplifier 30 has a differential input connected to the first voltage source 40. The comparator 60 comprises a differential operational transconductance amplifier (OTA). The replica amplifier 30 has a differential output connected to one input of the OTA. The other input of the OTA is connected to the second voltage source 50. The output of the OTA effectively comprises a variable current sink 22 connected to the feedback loop 70. In operation, the current source 21 and current sink 22 cooperate to establish the control voltage value $V_A$ at the gain control inputs of the controlled amplifier 10 and the replica amplifier 30. The feedback loop 70 constitutes a DC control loop. The output from the replica amplifier 30 is sensed by the comparator 60 and compared to $A.V_R$, a value corresponding to the worst case maximum gain that can be achieved by the controlled amplifier 10. Any difference between the output of the replica amplifier 30 and the worst case value causes the output of the comparator 60 to sink current from the feedback loop 70, thereby reducing the gain of both the replica amplifier 30 and the controlled amplifier 10. The feedback loop 70 settles on a stable operating point when the gain of the controlled amplifier 10, as modeled by the replica amplifier 30, is set to the worst case value.

The error signal from the comparator 60 may be employed to correct a tail current in the controlled amplifier 10, thereby forming a negative feedback control system. The control system then effectively operates to minimise tail current. An advantage with this arrangement is that it reduces circuit power which would otherwise be higher.

Figure 7:
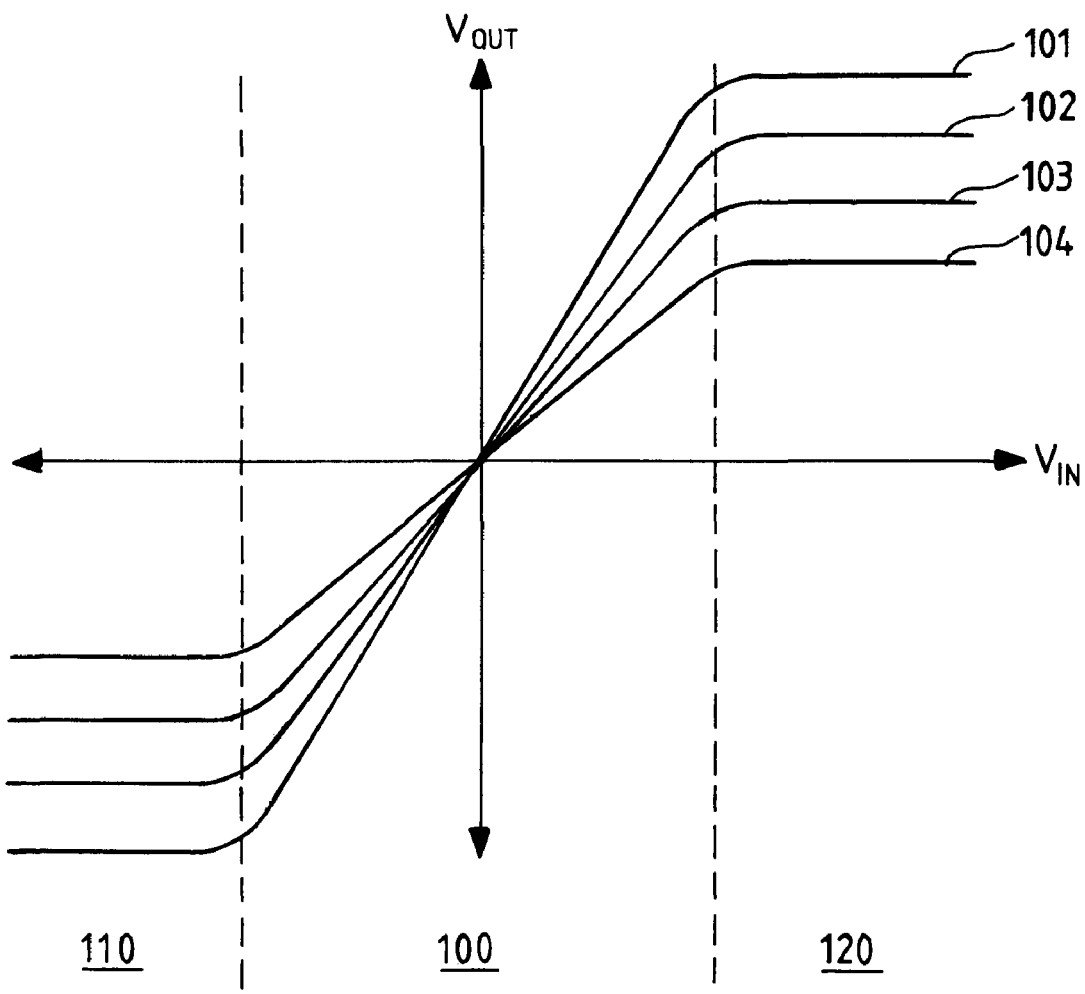
FIG. 7 is a graph of transfer functions corresponding to different operating extremes of an amplifier.

Referring to FIG. 7, the gain of an amplifier can be graphically represented by plotting corresponding inputs and outputs as Cartesian coordinates on orthogonal axes. The graph thus produced comprises a central linear region 100 bounded on either side by saturated regions 110 and 120. In the saturated regions 110,120, an increase in input magnitude does not produce a corresponding increase in output magnitude. The amplifier is saturated. In the linear region 100 there is a linear relationship between input magnitude and output magnitude. The gradient of the graph in the linear region 100 is representative of the gain of the amplifier. In a conventional amplifier, the gain may vary between different operating extremes. The operating extremes can include operating extremes in temperature, supply voltage, and semiconductor process. Such operating extremes are referred to in the art as corners. In FIG. 7, by way of example, there are shown four transfer functions 101-104, each corresponding to a different corner. The variation in gain between the four corners is apparent from the variation in slope of the four transfer functions 101-104 in the linear region 100.

Figure 8:
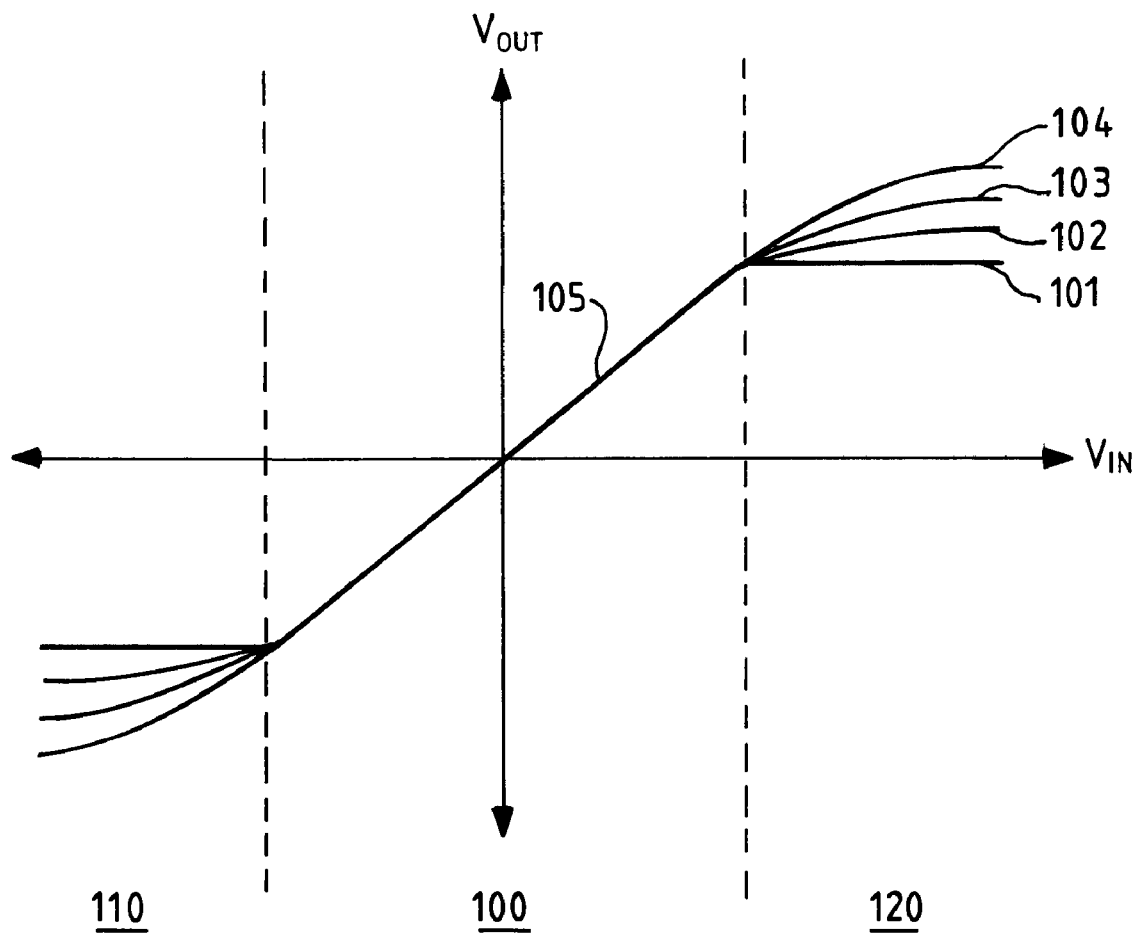
FIG. 8 is a graph of transfer functions corresponding to different operating extremes of a system in accordance with one embodiment of the present invention; and, FIG. 9 is a graph of transfer functions corresponding to different operating extremes of a system showing a convergence point in accordance with one embodiment of the present invention.
Figure 9:
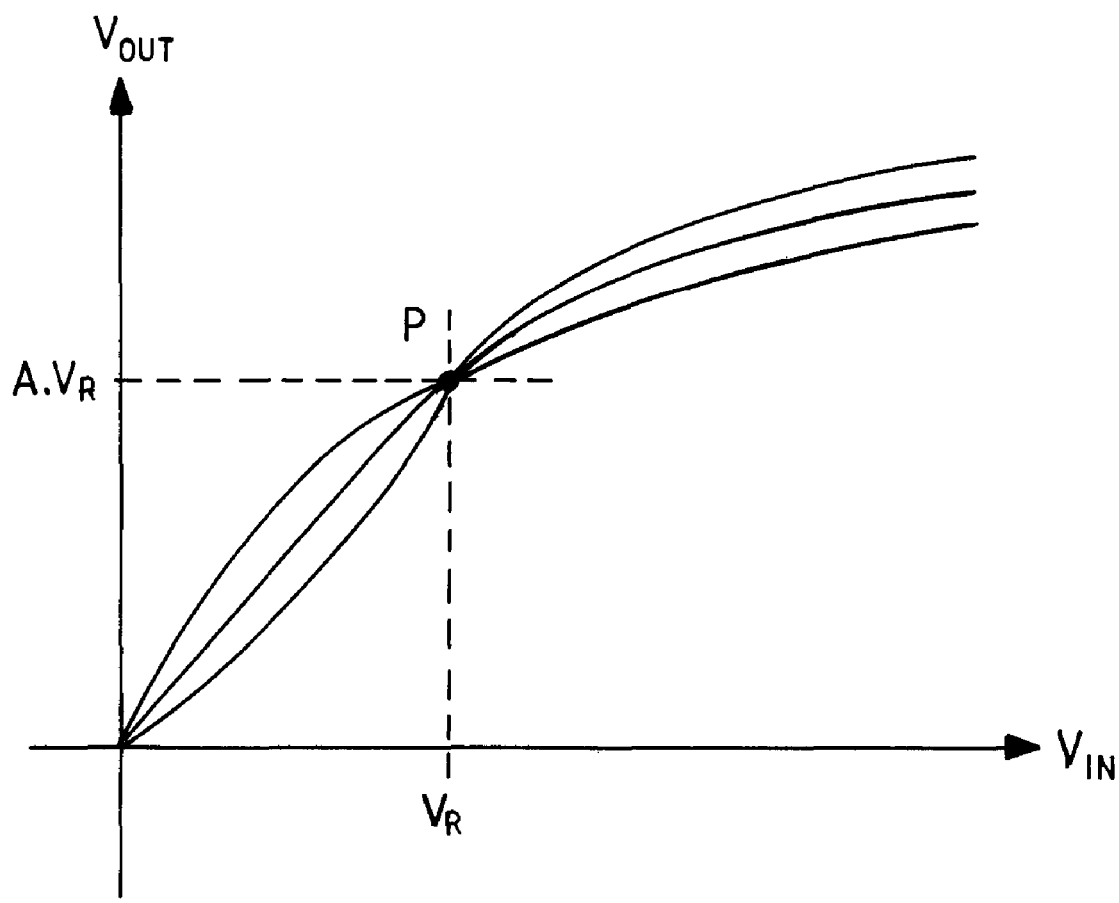

Referring now to FIG. 8, in an embodiment of the present invention, the feedback loop 70 operates to regulate the gain of the controlled amplifier 10 to a worst case value. Specifically, the feedback loop 70 converges the four corner transfer functions 101-104 to a common slope 105 in the linear region 100. Generally, embodiments of the present invention provide significant power saving across different operating extremes. In practice, there is some non-linear variation in and between each of transfer functions 101-104 within the linear region. However, referring now to FIG. 9, the selection of $V_R$ and $A.V_R$ determines a convergence point P common to all transfer functions 101-104. Accordingly, $V_R$ and $A.V_R$ can be selected to optimise the convergence point P for the particular application of the system.

In embodiments of the present invention herein before described, the gain of the controlled amplifier 10 is effectively regulated by analogue signal. In other embodiments of the present invention however, the gain of the controlled amplifier 10 may be regulated digitally. Also, in embodiments of the present invention herein before described, the gain of the controlled amplifier 10 is regulated by varying operating current. In other embodiments of the present invention however, the gain of the controlled amplifier 10 may be regulated by varying a different electrical value, such as supply voltage for example. In further embodiments of the present invention, a combination of such electrical values may be varied.

It will be appreciated that the present invention is especially useful in application specific integrated circuits, and in particular analogue application specific integrated circuits. It will also be appreciated that embodiments of the present invention may be implemented in any one or combination of semiconductor technologies, including bipolar transistor technology and field effect transistor technology.

The invention claimed is:

1. An amplifier control system for regulating a gain of a controlled amplifier, said control system comprising:
   a first signal source configured to generate a first reference signal;
   a replica amplifier configured to generate an output signal in dependence on said first reference signal, wherein said replica amplifier is a replica of said controlled amplifier;
   a second signal source configured to generate a second reference signal, wherein said second reference signal is a product of said first reference signal and a worst case value of a gain of said controlled amplifier;
   a comparator configured to generate an error signal in dependence on any difference between said second reference signal and said output from said replica amplifier; and
   a negative feedback loop configured to vary said gain of the controlled amplifier and said replica amplifier in dependence on said error signal.

2. The system of claim 1, wherein said replica amplifier comprises a variable gain amplifier having a variable gain input connected to said negative feedback loop.

3. The system of claim 2, wherein said feedback loop comprises a variable current sink connected to said variable gain input of said replica amplifier.

4. The system of claim 1, wherein said first signal source comprises a potential divider connected to said second signal source.

5. The system of claim 1, wherein the feedback loop comprises a sample and hold circuit configured to selectively sample said error signal in dependence on a binary enable signal.

6. The system of claim 5, wherein said replica amplifier comprises an enable input configured to selectively enable and disable said replica amplifier in dependence on the enable signal.

7. The system of claim 5, wherein said comparator comprises an enable input configured to selectively enable and disable the comparator in dependence on the enable signal.

8. A system of claim 1, wherein said controlled amplifier comprises a plurality of amplifier stages.

9. A system of claim 1, wherein said replica amplifier comprises fewer components than said controlled amplifier.

10. A circuit comprising:
    an amplifier control system for regulating a gain of a controlled amplifier, said control system comprising:
       a first signal source configured to generate a first reference signal;
       a replica amplifier configured to generate an output signal in dependence on said first reference signal, wherein said replica amplifier is a replica of said controlled amplifier;
       a second signal source configured to generate a second reference signal, wherein said second reference signal is a product of said first reference signal and a worst case value of a gain of said controlled amplifier;

a comparator configured to generate an error signal in dependence on a difference between said second reference signal and said output from said replica amplifier; and a negative feedback loop configured to vary said gain of the controlled amplifier and said replica amplifier in dependence on said error signal.

11. The circuit of claim 10, wherein said replica amplifier comprises a variable gain amplifier having a variable gain input connected to said negative feedback loop.

12. The circuit of claim 11, wherein said feedback loop comprises a variable current sink connected to said variable gain input of said replica amplifier.

13. The circuit of claim 10, wherein said first signal source comprises a potential divider connected to said second signal source.

14. The circuit of claim 10, wherein the feedback loop comprises a sample and hold circuit configured to selectively sample said error signal in dependence on a binary enable signal.

15. The circuit of claim 14, wherein said replica amplifier comprises an enable input configured to selectively enable and disable said replica amplifier in dependence on the enable signal.

16. The circuit of claim 14, wherein said comparator comprises an enable input configured to selectively enable and disable the comparator in dependence on the enable signal.

17. A circuit of claim 10, wherein said controlled amplifier comprises a plurality of amplifier stages.

18. A circuit of claim 10, wherein said replica amplifier comprises fewer components than said controlled amplifier.

* * * * *